United States Patent
Yamasaki

(10) Patent No.: US 7,589,541 B2
(45) Date of Patent: Sep. 15, 2009

(54) METHOD AND APPARATUS FOR INSPECTING SOLID-STATE IMAGE PICK-UP DEVICE

(75) Inventor: Nobuyoshi Yamasaki, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 104 days.

(21) Appl. No.: 11/452,935

(22) Filed: Jun. 15, 2006

(65) Prior Publication Data
US 2007/0001099 A1    Jan. 4, 2007

(30) Foreign Application Priority Data
Jun. 16, 2005    (JP)    ............... P. 2005-176468

(51) Int. Cl.
*G01R 31/302*    (2006.01)
(52) U.S. Cl. ................. 324/754; 324/752
(58) Field of Classification Search ............... None
See application file for complete search history.

(56) References Cited

U.S. PATENT DOCUMENTS

| 5,631,571 | A | * | 5/1997 | Spaziani et al. | 324/752 |
| 5,914,486 | A | * | 6/1999 | Yamamoto | 250/226 |
| 6,122,042 | A | * | 9/2000 | Wunderman et al. | 356/73 |
| 6,740,869 | B2 | * | 5/2004 | Okino et al. | 250/236 |
| 6,859,031 | B2 | * | 2/2005 | Pakdaman et al. | 324/233 |
| 6,960,759 | B2 | * | 11/2005 | Konagaya | 250/238 |

FOREIGN PATENT DOCUMENTS

| JP | 2-090645 A | 3/1990 |
| JP | 2004-213986 A | 7/2004 |

* cited by examiner

*Primary Examiner*—Minh N Tang
(74) *Attorney, Agent, or Firm*—Sughrue Mion, PLLC

(57) ABSTRACT

Provided is a method for inspecting a solid-state image pickup device by irradiating a solid-state image pickup device with measuring light emitted from a light source. The light source is a surface light emitter that includes a plurality of pixels, and each of the plurality of pixels includes a combination of a red LED, a green LED and a blue LED.

13 Claims, 6 Drawing Sheets

METHOD AND APPARATUS FOR INSPECTING SOLID-STATE IMAGE PICK-UP DEVICE

BACKGROUND OF THE INVENTION

1. Field of the Invention

The present invention relates to a method and apparatus for irradiating measuring light onto a solid-state image pickup device such as a CCD image sensor and a CMOS image sensor to inspect its electrical characteristics and in particular to an inspection method and inspection apparatus that allows downsizing of apparatus and high-speed inspection.

2. Description of the Related Art

When the electrical properties of a solid-state image pickup device, measuring light is irradiated onto the solid-state image pickup device. Related art inspection apparatus uses a halogen lamp as a light source and passes the light from the light source through a color filter to generate measuring light of a color necessary for measurement and through an ND filter to perform intensity adjustment of measuring light.

A halogen lamp has a short service life so that it must be changed frequently, which leads to higher costs. A mechanism for switching between color filters and introduction of an ND filter adds to the apparatus size. Further, filter switching at inspection takes time and a control signal is transmitted/received via GPIB (General Purpose Interface Bus: IEEE-488) communications thus resulting in lower control response.

JP-A-2-90645 discloses apparatus for inspecting a solid-state image pickup device using a light-emitting diode (LED) as a light source. By using an LED as a light source, the problems with the halogen lamp are solved.

While the color of the measuring light is not described in JP-A-2-90645, the technique described in JP-A-2004-213986, that is, the technique for controlling the value of a current applied to a red (R) LED, a green (G) LED and a blue (B) LED to perform color control of illumination light may be applied to apparatus for inspecting an solid-state image pickup device described in JP-A-2-90645 to do without a color filter. This downsizes the apparatus by the volume of the color filter and saves the time required for color filter switching during inspection.

The red LED, green LED and blue LED are respectively point light sources. Having certain sizes, the LEDs must be arranged in separate positions in the same inspection apparatus. It is thus necessary to provide a condensing optical system and light scattering means (obscure glass described in JP-A-2-90645) to keep uniform the additive color of light across the light receiving face of the solid-state image pickup device.

As mentioned above, a condensing optical system and light scattering means are required in inspection apparatus even when an LED is used as a light source for the inspection apparatus. Thus the inspection apparatus cannot be further downsized.

SUMMARY OF THE INVENTION

An object of the invention is to provide a method and apparatus for inspecting a solid-state image pickup device capable of downsizing the apparatus as well as allowing quick inspection.

The invention provides a method and apparatus for inspecting a solid-state image pickup device wherein the method and apparatus use, in the inspection of a solid-state image pickup device by irradiating measuring light emitted from a light source, a surface light emitter composed of plural pixels each including a combination of a red LED, a green LED and a blue LED as the light source.

The surface light emitter for the inventive method and apparatus for inspecting a solid-state image pickup device may comprise an organic EL device.

The surface light emitter for the inventive method and apparatus for inspecting a solid-state image pickup device may be provided integrally with a probe card for causing a probe pin to abut against the electrode pad of the solid-state image pickup device above the center through hole of the prove card.

The surface light emitter for the inventive method and apparatus for inspecting a solid-state image pickup device may be provided in a lid body which is arranged above a socket, to which a solid-state image pickup device package is attached, and is capable of opening and closing an area above the socket.

DETAILED DESCRIPTION OF THE INVENTION

An embodiment of the invention will be described referring to drawings.

FIRST EMBODIMENT

Figure 1:
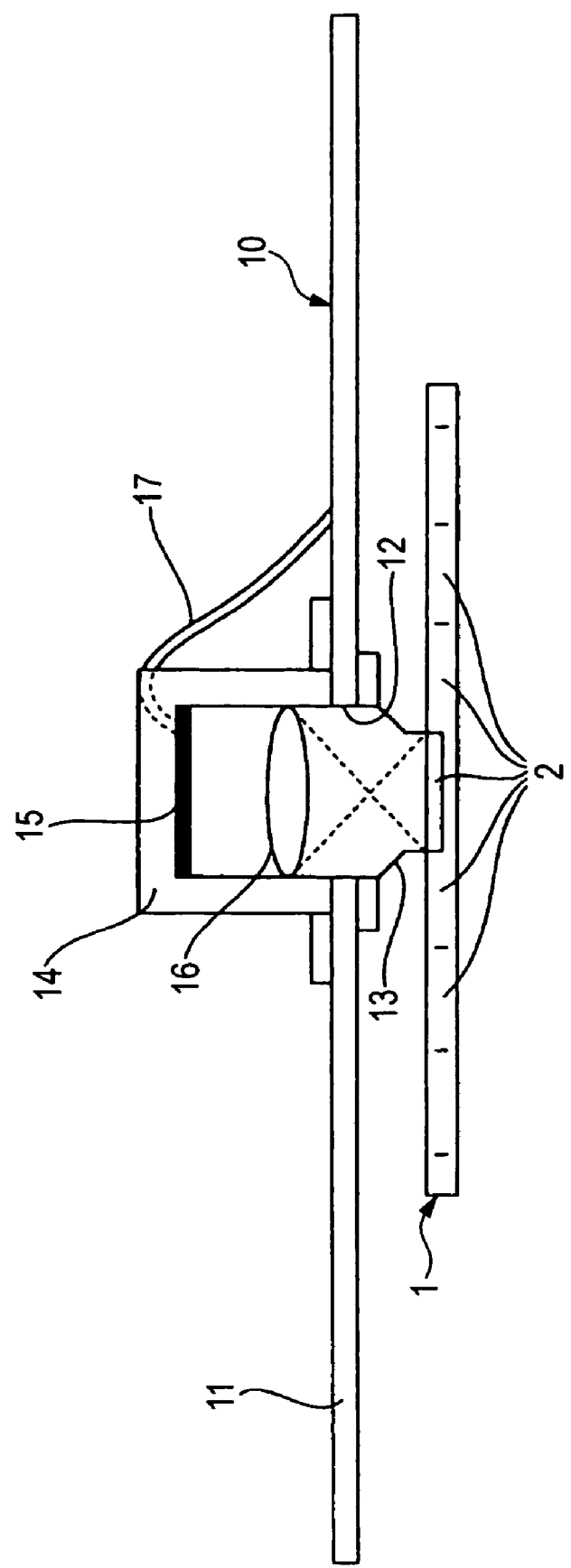
FIG. 1 is a schematic cross-sectional view of solid-state image pickup device inspection apparatus according to the first embodiment of the invention.
Figure 2:
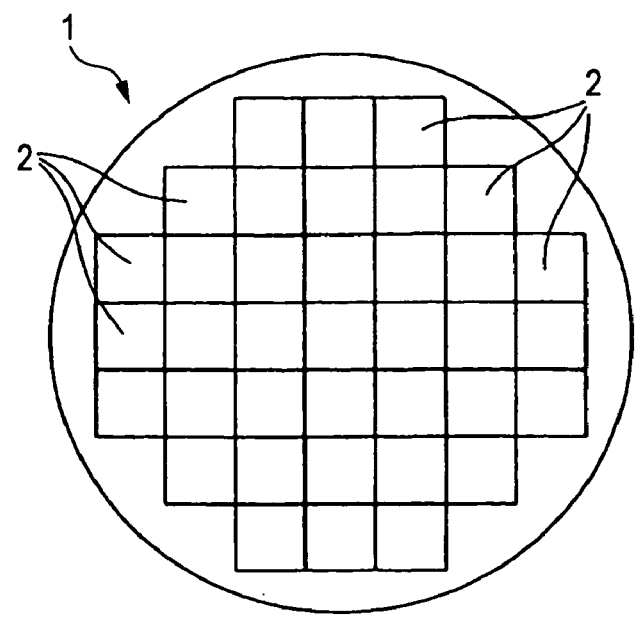
FIG. 2 is a schematic surface view of a semiconductor wafer shown in FIG. 1.

FIG. 1 is a schematic cross-sectional view of solid-state image pickup device inspection apparatus according to the first embodiment of the invention. On the surface of a disc-shaped semiconductor wafer 1 as a target of inspection, for example as shown in FIG. 2 are formed via an integrated circuit technique a large number of (37 in the illustrated example) solid-state image pickup devices 2. A solid-state image pickup device inspection apparatus 10 according to the intention is designed to inspect individual solid-state image pickup devices in order while moving with respect to the semiconductor wafer 1.

Figure 3:
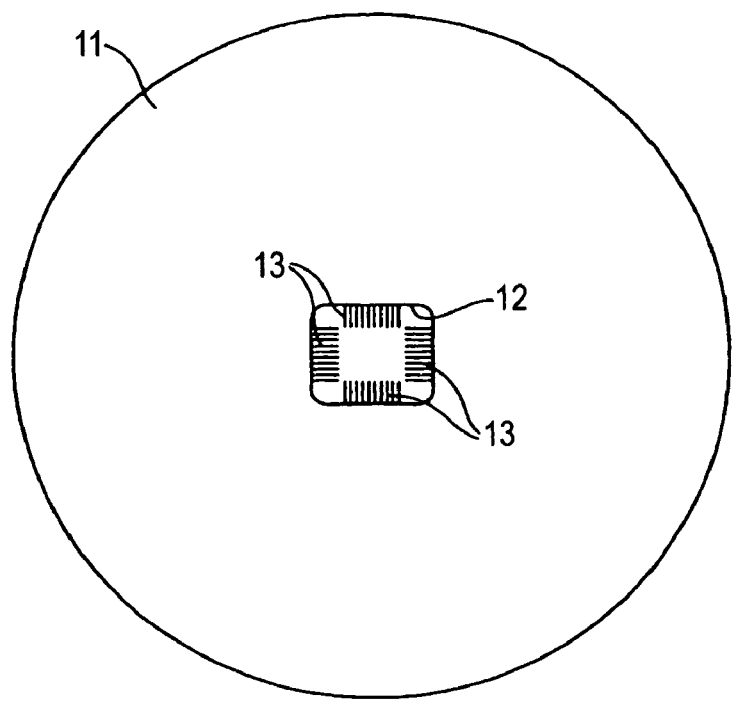
FIG. 3 is a schematic plan view of the semiconductor wafer side of probe card shown in FIG. 1.

The solid-state image pickup device inspection apparatus 10 includes a disc-shaped probe card 11 shown in FIG. 3. In the center of the probe card 11 is made a rectangular through hole 12. From the sides of the through hole 12 are protruded a large number of probe pins 13 extending toward the center and the semiconductor wafer 1.

To the side opposite to the semiconductor wafer 1 at the center of the probe card 11 is fixed a bottomed cylindrical member 14 for shielding the through hole 12 from light. To the internal bottom surface of the bottomed cylindrical member 14 is attached a surface light emitter 15. In the illustrated example, in the bottomed cylindrical member 14 is provided a lens 16 for condensing the light emitted from the surface light emitter 15.

The surface light emitter 15 is connected to probe card 11 via a power supply line 17. The solid-state image pickup device inspection apparatus 10 is connected to a tester (not shown) and communicates an inspection control signal and a detection signal between the tester and the probe card 11 as well as supplies a voltage pulse to the surface light emitter 15 via the power supply line 17.

Figure 4:
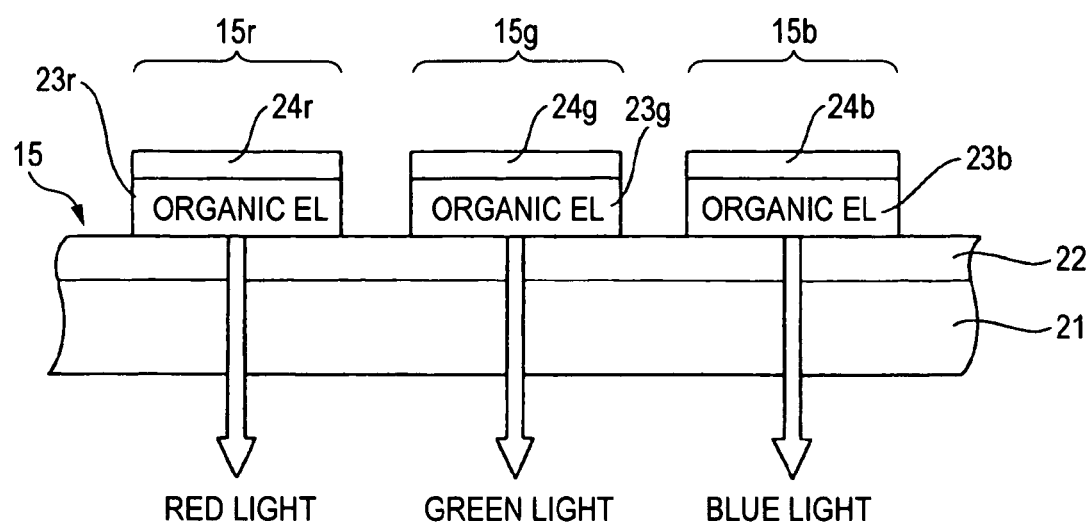
FIG. 4 is a schematic cross-sectional view of a single pixel of the surface light emitter shown in FIG. 1.

FIG. 4 is a schematic cross-sectional view of a single pixel of the surface light emitter 15. The surface light emitter 15 according to this embodiment is composed of numerous pixels arranged on a plane where each pixel includes a red color luminescent organic EL device 15r, a green color luminescent organic EL device 15g and a blue color luminescent organic EL device 15b in order to obtain full emitting light colors.

The surface light emitter 15 includes: a transparent substrate 21; a transparent common negative electrode film 22 laminated on the transparent substrate 21; a red color luminescent organic EL layer 23r, a green color luminescent organic EL layer 23g and a blue color luminescent organic EL layer 23b laminated on the negative electrode film 22; and positive electrode films 24r, 24g, 24b respectively laminated on the organic EL layers 23r, 23g, 23b.

Such a surface light emitter 15 may be manufactured exclusively as a surface light emitter although for example an organic EL device of several tens of pixels already used as a display screen on the back of a digital still camera may be used as the surface light emitter 15.

In case a solid-state image pickup device 2 on the semiconductor wafer 1 is inspected using thus configured solid-state image pickup device inspection apparatus 10, the semiconductor wafer 1 arranged below the inspection apparatus 10 are moved in horizontal direction to bring the solid-state image pickup device 2 as a target of inspection just below the through hole 12 in the probe card 11. The inspection apparatus 10 is lowered with a transport mechanism (not shown) to cause a probe pin 13 to abut against the electrode pad (not shown) of the solid-state image pickup device 2 under a predetermined pin pressure.

A tester (not shown) applies a voltage pulse across each of the positive electrode films 24r, 24g, 24b and the negative electrode film 22 of each pixel of the surface light emitter 15 via the power supply line 17. Thus causes each organic EL layers 23r, 23g, 23b to emit red (R) light, green (G) light and blue (B) light respectively. The light is emitted as measuring light through the negative electrode film 22 and the transparent substrate 21 toward the solid-state image pickup device 2.

The voltage applied across the positive electrode film and the negative electrode film and the voltage pulse width are controlled by the tester (not shown) so that the light quantity of each color is controller and red light, green light and blue light are added and light of an arbitrary color-is emitted as measuring light. Each pixel of the surface light emitter 15 is formed minutely so that light of an arbitrary color is uniformly emitted from the light emitting face of the surface light emitter 15.

The measuring light is condensed by the condenser 16 and irradiated onto the light receiving face of the solid-state image pickup device 2 via the through hole 12. The solid-state image pickup device 2 outputs on an electrode pad an output signal obtained by receiving the measuring light. The output signal is collected by the tester via the probe pin 13.

According to this embodiment, light of each color is obtained without using a color filter. A color filter or other switching mechanism is made unnecessary thus reducing the apparatus size. A surface light emitter is used to uniformly emit light of an arbitrary color. This makes it possible to irradiate uniform light onto a solid-state image pickup device without introducing light scattering means, thus further reducing the apparatus size.

While a condenser 16 is used in the example shown in FIG. 1, the condenser 16 is also unnecessary as long as the light quantity of the surface light emitter 15 is sufficient, which further reduces the apparatus size.

The inspection apparatus of this embodiment controls the color of the measuring light to an arbitrary color by simply controlling the voltage pulse. This eliminates the need for controlling the surface light emitter 15 via GPIB communications thereby allowing quick inspection.

A configuration where the tester is capable of controlling the emitted color of individual pixels of the surface light emitter 15 allows inspection of the solid-state image pickup device 2 by causing the surface light emitter 15 to display (emit) an arbitrary color image.

SECOND EMBODIMENT

Figure 5:
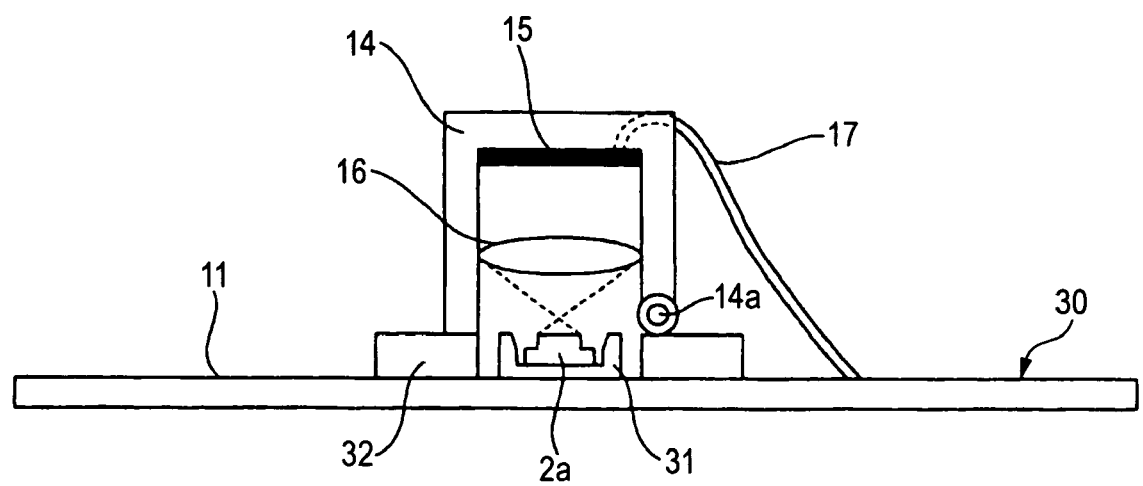
FIG. 5 is a schematic cross-sectional view of solid-state image pickup device inspection apparatus according to the second embodiment of the invention.

FIG. 5 is a schematic cross-sectional view of solid-state image pickup device inspection apparatus according to the second embodiment of the invention. While the solid-state image pickup device 2 on the semiconductor wafer 1 is inspected in the first embodiment shown in FIG. 1, the solid-state image pickup device inspection apparatus 30 inspects a solid-state image pickup device cut out from a semiconductor wafer and accommodated in a package 2a. The same members as those in the first embodiment are given the same signs in the following description.

The solid-state image pickup device inspection apparatus 30 according to this embodiment includes a disc-shaped card 11 connected to a tester (not shown). To the center of the disc-shaped card 11 is fixed an open-top type IC socket 31 connected to wiring (not shown) in the disc-shaped card 11. To the IC socket 31 is detachably attached the package 2a as a target of inspection accommodating a solid-state image pickup device.

To the center of the disc-shaped card 11 is fixed a rectangular ring-shaped base 32 surrounding the IC socket 31. On the ring-shaped base 32 is placed a bottomed cylindrical member (lid body) 14 for shielding the IC socket 31 from light. To the internal bottom surface of the bottomed cylindrical member 14 is attached the same surface light emitter 15 as in the first embodiment.

Figure 6:
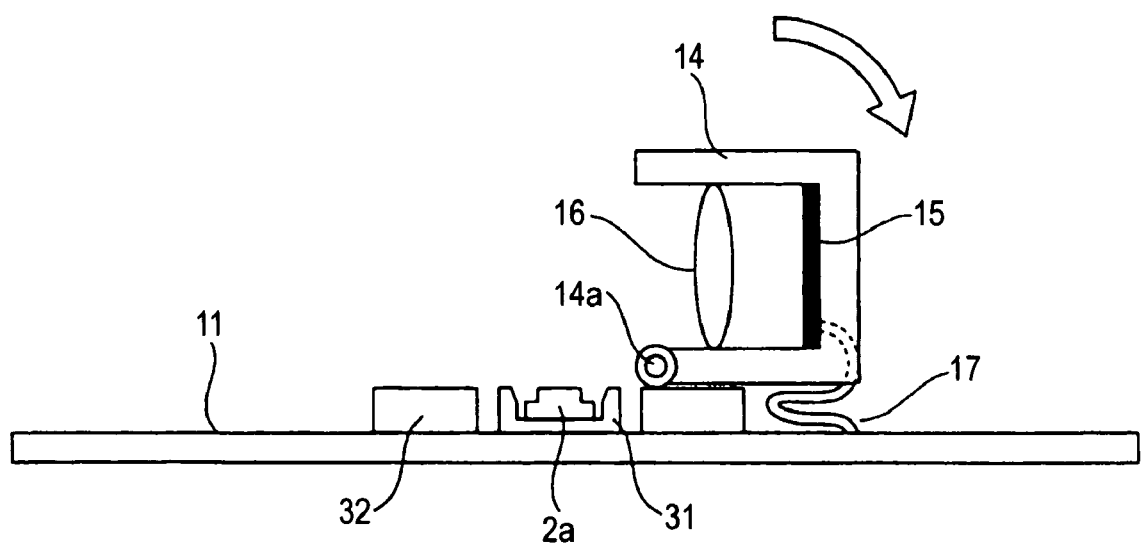
FIG. 6 is a schematic cross-sectional view of the solid-state image pickup device inspection apparatus shown in FIG. 5 accommodating a package as a target of inspection.

One side of the opening side of the bottomed cylindrical member 14 is coupled to one side of the rectangular ring-shaped base 32 via a hinge 14a. This allows the bottomed cylindrical member 14 to rotate about the hinge 14a and allows the IC socket 31 placed in the center of the ring-shaped base 32 to be opened/closed by way of the bottomed cylindrical member 14. FIG. 6 shows a state where the bottomed cylindrical member 14 is opened to expose the solid-state image pickup device package 2a to external light.

In case a solid-state image pickup device 2 in the package 2a is inspected using thus configured solid-state image pickup device inspection apparatus 30, the bottomed cylindrical member 14 is opened as shown in FIG. 6 to attach the package 2a as a target of inspection to the IC socket 31 and the bottomed cylindrical member 14 is closed as shown in FIG. 1.

In the state of FIG. 1, a tester (not shown) applies a voltage pulse on the surface light emitter 15 via the power supply line 17 to perform light emission control of the surface light emitter 15, same as in the first embodiment. Thus the surface light emitter 15 to emit measuring light of a uniform arbitrary color and the solid-state image pickup device in the package 2a receives measuring light condensed by the condenser 16. The solid-state image pickup device in the package 2a outputs an output signal obtained by receiving measuring light to each terminal of the IC socket 31. The output signal is collected by the tester.

The solid-state image pickup device inspection apparatus according to this embodiment provides the same effect as the first embodiment. While the condenser 16 is used in this embodiment also, the condenser 16 is also unnecessary as long as the light quantity of the surface light emitter 15 is sufficient, which further reduces the apparatus size.

Figure 7:
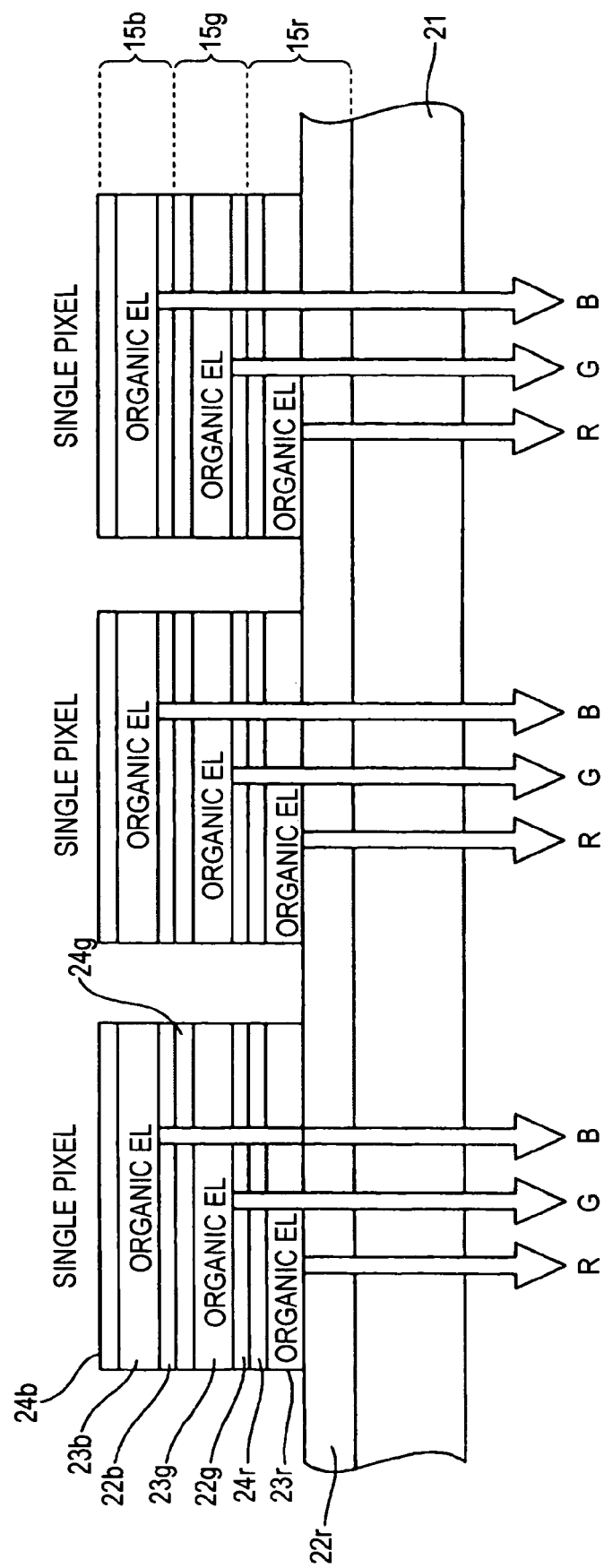
FIG. 7 is a schematic cross-sectional view of three pixels of a surface light emitter different from that shown in FIG. 4.

FIG. 7 is a schematic cross-sectional view of three pixels of a surface light emitter whose light quantity has been increased. While the surface light emitter shown in FIG. 4 arranges a red color luminescent organic EL device 15*r*, a green color luminescent organic EL device 15*g* and a blue color luminescent organic EL device 15*b* on a plane in each pixel, the counterpart shown in FIG. 7 includes the red color luminescent organic EL device 15*r*, the green color luminescent organic EL device 15*g* and the blue color luminescent organic EL device 15*b* laminated in this order in each pixel. The positive electrode films and negative electrode films sandwiching the organic EL layers 23*r*, 23*g*, 23*b* are transparent electrode films in each pixel. Note that the positive electrode film 24*b* in the uppermost layer is not transparent in order to serve as a reflective film also.

The configuration shown in FIG. 7 obtains an emitted light quantity three times as large as that shown in FIG. 4 as long as the area of the surface light emitter is the same.

According to the invention, uniform light of an arbitrary color is emitted from a surface light emitter so that a color film or light scattering means are no more necessary thus reducing the apparatus size. It is possible to quickly make control to obtain an arbitrary color thus reducing the inspection time.

The solid-state image pickup device inspection apparatus according to the invention has a compact size and allows quick inspection so that it is useful for inspection of an image sensor such as a CCD and a CMOS.

The entire disclosure of each and every foreign patent application from which the benefit of foreign priority has been claimed in the present application is incorporated herein by reference, as if fully set forth.

What is claimed is:

1. A method for inspecting a solid-state image pickup device by irradiating the solid-state image pickup device with measuring light emitted from a light source,
   wherein the light source is a surface light emitter comprising a plurality of pixels each including a combination of a red light emitting diode (LED), a green LED and a blue LED, and
   wherein the measuring light is uniform light of an arbitrary color which is a combination of red light, green light and blue light emitted from the red LED, the green LED and the blue LED, respectively.

2. The method for inspecting a solid-state image pickup device according to claim 1,
   wherein the surface light emitter comprises an organic electroluminescence (EL) device.

3. The method for inspecting a solid-state image pickup device according to claim 1,
   wherein a probe card having a center through hole in its center and having probe pins to be abutted against an electrode pad of the solid-state image pickup device is provided, and
   the light source is provided integrally with the probe card so as to be located above the center through hole of the probe card.

4. The method for inspecting a solid-state image pickup device according to claim 1,
   wherein the solid-state image pickup device is a solid-state image pickup device package,
   the solid-state image pickup device package is attached to a socket, and
   the surface light emitter is provided in a lid body which is arranged above the socket and opens and closes an area above the socket.

5. An apparatus for inspecting a solid-state image pickup device by irradiating the solid-state image pickup device with measuring light emitted from a light source, the apparatus comprising
   a surface light emitter comprising a plurality of pixels each including a combination of a red light emitting diode (LED), a green LED and a blue LED, as the light source,
   wherein the measuring light is uniform light of an arbitrary color which is a combination of red light, green light and blue light emitted from the red LED, the green LED and the blue LED, respectively.

6. The apparatus for inspecting a solid-state image pickup device according to claim 5,
   wherein the surface light emitter comprises an organic electroluminescence (EL) device.

7. The apparatus for inspecting a solid-state image pickup device according to claim 5, further comprising:
   a probe card having a center through hole in its center and having probe pins to be abutted against an electrode pad of the solid-state image pickup device,
   wherein the light source is provided integrally with the probe card so as to be located above the center through hole of the probe card.

8. The apparatus for inspecting a solid-state image pickup device according to claim 5, further comprising:
   a socket on which a solid-state image pickup device package serving as the solid-state image pickup device is to be attached; and
   a lid body which is arranged above the socket and opens and closes an area above the socket,
   wherein the surface light emitter is provided in the lid body.

9. The method for inspecting a solid-state image pickup device according to claim 1, wherein the measuring light is not scattered by a scattering element facing the surface light emitter, before the measuring light is irradiated on the solid-state image pickup device.

10. The apparatus for inspecting a solid-state image pickup device according to claim 5, wherein the apparatus does not include a scattering element facing the surface light emitter to scatter the measuring light before the measuring light is irradiated on the solid-state image pickup device.

11. The apparatus for inspecting a solid-state image pickup device according to claim 5, further comprising a condensing lens, wherein no optical element intervenes between the surface light emitter and the condensing lens.

12. The method for inspecting a solid-state image pickup device according to claim 1, further comprising:
   controlling a voltage and a voltage pulse to control light quantity of each of the red light, the green light and the blue light,
   wherein the uniform light of the arbitrary color is emitted based on the controlled light quantity of each of the red light, the green light and the blue light.

13. The apparatus for inspecting a solid-state image pickup device according to claim 5, further comprising:
   a tester that controls a voltage and a voltage pulse to control light quantity of each of the red light, the green light and the blue light,
   wherein the uniform light of the arbitrary color is emitted based on the controlled light quantity of each of the red light, the green light and the blue light.

* * * * *